United States Patent [19]
Boudou et al.

[11] Patent Number: 4,916,809
[45] Date of Patent: Apr. 17, 1990

[54] METHOD FOR PROGRAMMABLE LASER CONNECTION OF TWO SUPERIMPOSED CONDUCTORS OF THE INTERCONNECT SYSTEM OF AN INTEGRATED CIRCUIT

[75] Inventors: Alain Boudou, Vert; Marie-Francoise Bonnal, Fontenay Le Fleury, both of France

[73] Assignee: Bull S.A., Paris, France

[21] Appl. No.: 232,942

[22] Filed: Aug. 17, 1988

Related U.S. Application Data

[62] Division of Ser. No. 71,473, Jul. 9, 1987, abandoned.

[30] Foreign Application Priority Data

Jul. 11, 1986 [FR] France ................................ 86 10205

[51] Int. Cl.$^4$ ............................................. H01K 3/10
[52] U.S. Cl. ............................. 29/852; 148/DIG. 71; 219/121.19; 357/67; 427/97
[58] Field of Search .................. 29/852, 830; 148/DIG. 71, DIG. 93, DIG. 94, DIG. 95; 219/121.19

[56] References Cited

U.S. PATENT DOCUMENTS

| | | | |
|---|---|---|---|
| 3,549,432 | 12/1970 | Sivertsen | 148/DIG. 71 X |
| 3,584,183 | 6/1971 | Chiaretta | 148/DIG. 71 X |
| 4,258,468 | 3/1981 | Balde | 29/830 |
| 4,413,272 | 11/1983 | Mochizuki et al. | 357/65 |
| 4,531,144 | 7/1985 | Holmberg | 357/71 |
| 4,561,906 | 12/1985 | Calder et al. | 357/67 X |
| 4,609,809 | 9/1986 | Yamaguchi et al. | 219/121.19 X |
| 4,642,160 | 2/1987 | Burgess | 427/97 X |
| 4,659,427 | 4/1987 | Barry et al. | 156/643 |
| 4,674,176 | 6/1987 | Tuckerman | 357/67 X |

OTHER PUBLICATIONS

Wei-Wha WU; "Automated Welding Customizes Programmable Logic Arrays", Jul. 1982, Electronics Intl., vol. 55, No. 14, pp. 159-162.
Platakis; Mechanism of Laser—Induced Metal Semiconductor Electrical Connections in MOS Structures, J. Appl. Phys. 47:5, May 1976.
Raffel et al: Laser Programmed VIAS for Restructurable VLSI; IEEE 1980.
Smith et al: Laser Induced Personalization & Alterations of LSI & VLSI Circuits, Nov. 16-17, 1981; Proceedings First Intl. Laser Processing Conf.

Primary Examiner—Carl J. Arbes
Attorney, Agent, or Firm—Kerkam, Stowell, Kondracki & Clarke

[57] ABSTRACT

A method for creating a programmable connection by a laser beam in superimposed conductors of an interconnect system of an integrated circuit is provided wherein each of the conductors is formed of a metal strip provided with an upper and a lower film of a material having a melting point substantially higher than a melting point of said metal strip. The conductors are separated by a dielectric layer and the upper conductor is covered by an insulating passivation layer. The connection is effected through an opening in the insulating layer, the upper conductor, the dielectric layer, and at least a portion of said lower conductor. The method for creating the connection consists of applying at least a first laser beam pulse to make an initial opening in at least said insulating layer; and selectively controlling one or more of the parameters of the laser beam, such as power, diameter, number of pulses and duration of pulses. The laser beam is then used to create an opening through the insulating layer, upper conductor, dielectric layer, and through at least a portion of said lower conductor and further forms a substantially continuous ring by controlled melting. The ring begins respectively at the upper and lower conductors and extends between said conductors to form the connection.

30 Claims, 2 Drawing Sheets

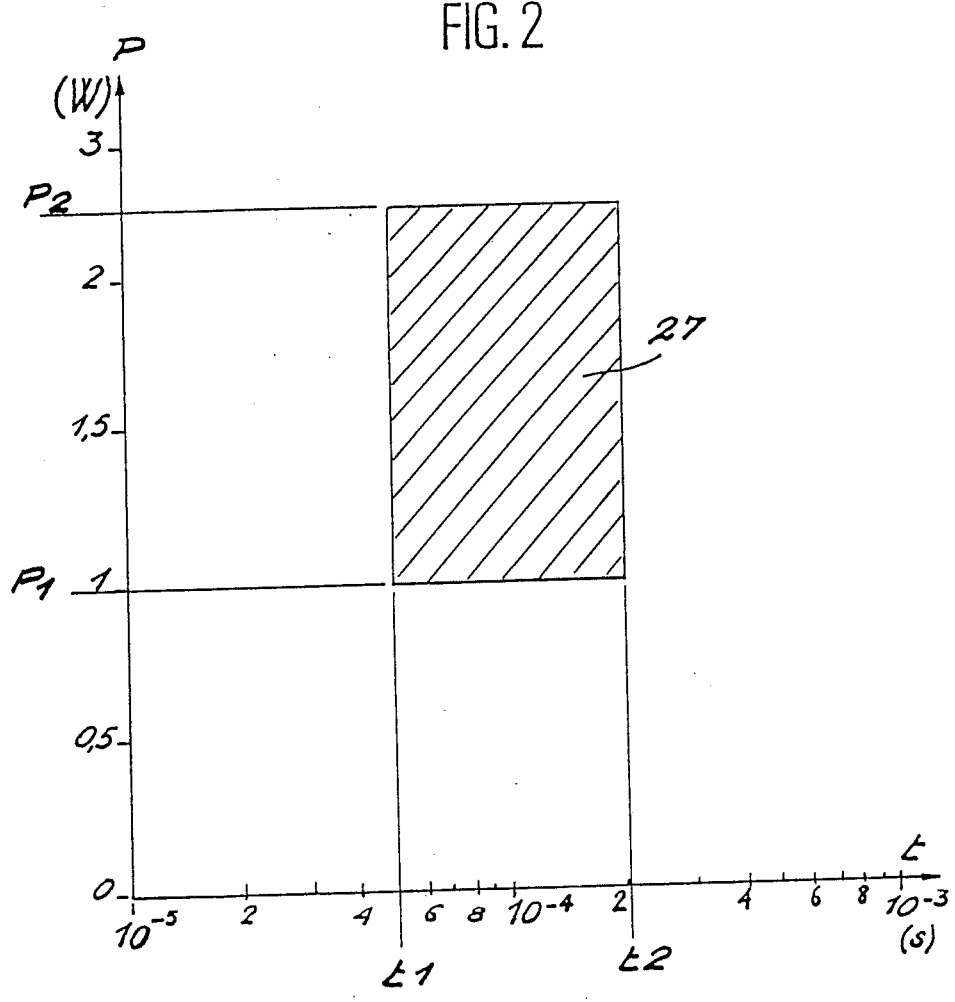

METHOD FOR PROGRAMMABLE LASER CONNECTION OF TWO SUPERIMPOSED CONDUCTORS OF THE INTERCONNECT SYSTEM OF AN INTEGRATED CIRCUIT

This is a divisional, of application Ser. No. 071,473, filed July 9, 1987 now abandoned.

FIELD OF THE INVENTION

The invention relates to a method of establishing a programmable connection, or linking of two superimposed conductors of the interconnect system of an integrated circuit by laser, and to the integrated circuit chip thus produced.

BACKGROUND OF THE INVENTION

An integrated circuit substantially comprises a semiconductor substrate incorporating electronic components and having a system of conductors interconnecting these components. The interconnect system may comprise a plurality of conductive layers, typically insulated from one another by dielectric layers, and connected to one another at certain points by vias that pass through the dielectric layers. Each conductive layer comprises numerous conductors parallel to one another in a direction orthogonal to the conductors of an adjacent conductive layer. In practice, the conductors are ordinarily strips, substantially made of aluminum, but other materials are beginning to be used, such as tungsten and silicides of titanium or tantalum.

The invention relates to integrated circuits in which metal strips of conductors of the interconnect system are provided with upper and lower films made of a material having a melting point substantially higher than that of the metal comprising the strips. Titanium-tungsten may be used for these films. An insulating passivation layer covers the upper conductive layer. Silicon nitride ($Si_3N_4$) presently performs this function. The passivation layer generally serves to protect the integrated circuits beneath it mechanically, chemically and electrically.

Attempts are currently being made to make programmable connections of two superimposed conductors of the interconnect system using a laser. The connections, or links, are programmed for the reconfiguration of a circuit to overcome a defect, or for connecting a substitute circuit to a defective circuit using the technique of redundancy of the functional blocks on a chip.

The invention relates to methods that comprise applying a laser beam perpendicular to the layers of the interconnect system of the integrated circuit to make an opening in the insulating layer, an upper conductor, the dielectric layer and at least part of the lower conductor, and to form an electrical connection of the two conductors in this opening.

One known method of programmable connection by laser of two superimposed conductors is described in particular in the article by N. X. Platakis in the Journal of Applied Physics, Vol. 47, No. 5, May 1976, pages 2120–2128. At the point where the connection is desired, a laser beam is applied, the power, diameter, and number and duration of pulses of which are determined in such a way as to open up the upper conductor progressively, to eliminate the dielectric layer by explosion, and to form a contact between the two conductors by ejection of the melted material of the lower conductor up to the level of the upper conductor. The two conductors are then connected with one another by the solidified ejected material on the walls of a crater, which thus has the approximate form of a metallized hole. However, it will be appreciated that the uncontrollable ejection of melted material from the lower conductor located below the laser beam under identical conditions will result in different configurations of the linkage of the conductors in each crater. It follows that the links forms by this method under identical conditions exhibit different properties of electrical connection. Experience has confirmed the deficiencies of this method in terms of replicability and reliability.

Another known method for programmable laser connection of two superimposed conductors is described in particular in the article by J. I. Raffel et al., entitled "Laser Programmed Vias for Restructurable VLSI", published in the Technical Digest of the International Electron Devices Meeting, 1980, pages 132–135. This method comprises using amorphous silicon in the dielectric layer at the level of the connection point. The use of amorphous silicon in predetermined regions of the dielectric layer has the disadvantage that it complicates the manufacturing process of the integrated circuit and prevents the programming of any link by laser except in these regions.

OBJECT AND SUMMARY OF THE INVENTION

The invention introduces an effective and reliable method for establishing a programmable connection, at any point of intersection of two superimposed conductors that are provided with the aforementioned films and include a passivation layer.

The method according to the invention for establishing a programmable connection of two superimposed conductors of the interconnect system of an integrated circuit using a laser, in which the two conductors are separated by a dielectric layer and the upper conductor is covered by an insulating passivation layer, is of the type in which a laser beam is applied to make an opening in the insulating layer, the upper conductor, the dielectric layer and at least a portion of the lower conductor, and in this opening a connection of the two conductors is formed. The method is characterized in that since the two conductors are each formed of a metal strip provided with upper and lower films of a material having a melting point substantially higher than that of the metal comprising the strip, the power, the diameter, and the number and duration of pulses of the laser beam are determined such that, beginning at the two conductors in the opening, beads are formed that unite with one another to form the connection.

The method according to the invention has an interconnect system including at least one laser programmed opening for the connection of two superimposed conductors, separated by a dielectric layer, the upper conductor being covered by an insulating passivation layer. This integrated circuit is characterized in that since the two conductors are each made of a metal strip provided with upper and lower films of a material having a melting point substantially higher than that of the metal comprising the strip, the connection is made by uniting the two beads formed in the opening, beginning at the respective conductors.

The characteristics and advantages of the invention will become apparent from the ensuing description of an exemplary embodiment taken in conjunction with the drawings.

BRIEF DESCRIPTION OF THE DRAWINGS

FIG. 2 is a diagram showing how the parameters of the laser beam are determined for performing the method according to the invention.

DESCRIPTION OF THE PREFERRED EMBODIMENT

Figure 1A:
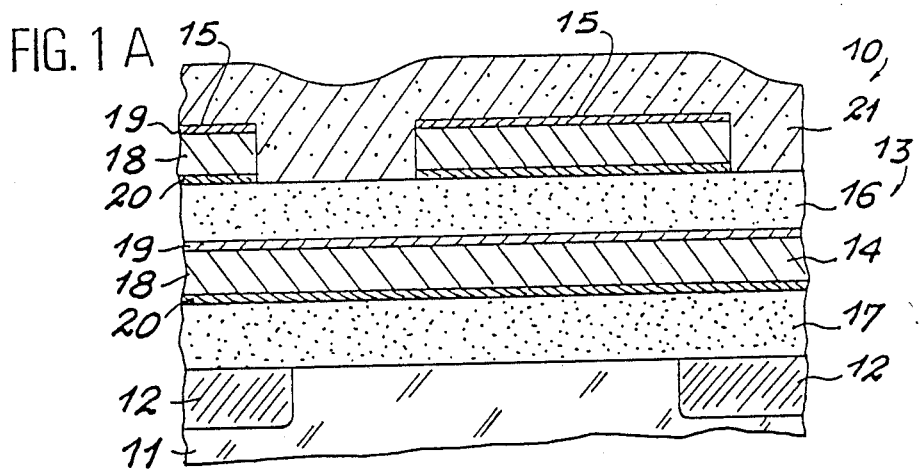
FIG. 1A is a fragmentary sectional view of an integrated circuit, to which the method according to the invention is applicable.

FIG. 1A is a fragmentary sectional view of an integrated circuit 10 to which the method according to the invention is applied. The integrated circuit 10 substantially comprises a semiconductor substrate 11, one face of which incorporates the electronic components 12, and a system 13 for interconnecting the components 12. The interconnect system 13 comprises conductors distributed in at least two superimposed conductive layers 14, 15, which are insulated from one another by a dielectric layer 16 and extend above the substrate 11 via an intervening insulating layer 17. The conductors of an individual layer are parallel to one another in a direction perpendicular to the conductors of an adjacent layer. The section shown in FIG. 1A is taken along the direction of the lower conductors 14 and transversally intersects the upper conductors 15.

In order to be applicable to the invention, the conductors of the two layers 14, 15 are each formed of a metal strip 18 provided with upper and lower films 19 and 20, respectively, of a material having a melting point substantially higher than that of the metal of the strip 18. All the conductors 15 of the upper conductive layer are covered by an insulating passivation layer 21, for example of silicon nitride ($Si_3N_4$).

In practice, for example, the metal strips 18 are substantially made of aluminum having a thickness on the order of 500 to 800 nanometers (nm), and the films 19, 20 are of titaniumtungsten having a thickness substantially less than that of the strips 18, being on the order of 10 nm to 150 nm. The insulating layers 16, 17 also typically have a thickness on the order of 800 nm and are ordinarily made of silicon dioxide ($SiO_2$).

In the particular case used for illustrating the invention, the metal strips are of aluminum alloyed with 4% copper and 1% silicon. The thicknesses or the various elements are as follows: the conductor strips 18 of the lower layer 14, 500 nm, and the conductor strips 18 of the upper layer 15, 650 nm; the upper films 19, 30 nm, and the lower films, 100 nm; and finally, the insulating layer 17 and the passivation layer 21, each 800 nm, and the dielectric layer 16, 730 nm. On the other hand, the with of the lower conductors 14 is 60 micrometers ($\mu m$), while the width of the upper conductors 15 is 107 $\mu m$.

Figure 1B:
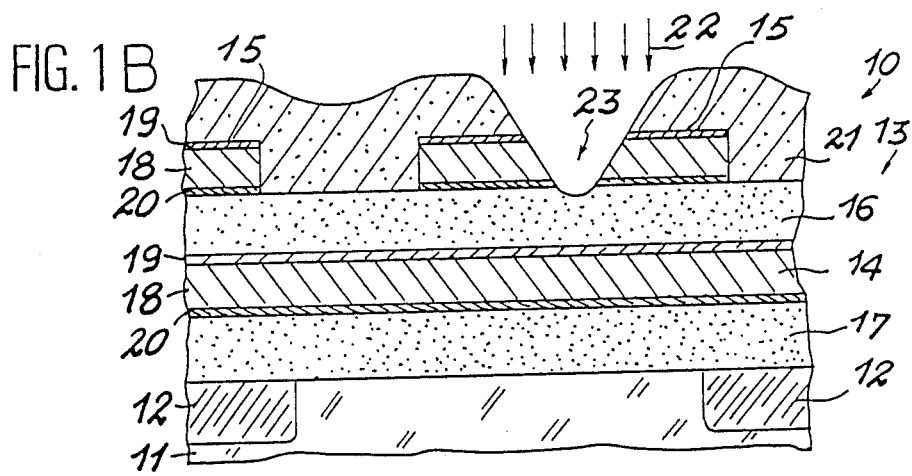
FIGS. 1B and 1C are views of the integrated circuit should in FIG. 1A, respectively illustrating two steps in the method according to the invention.
Figure 1C:
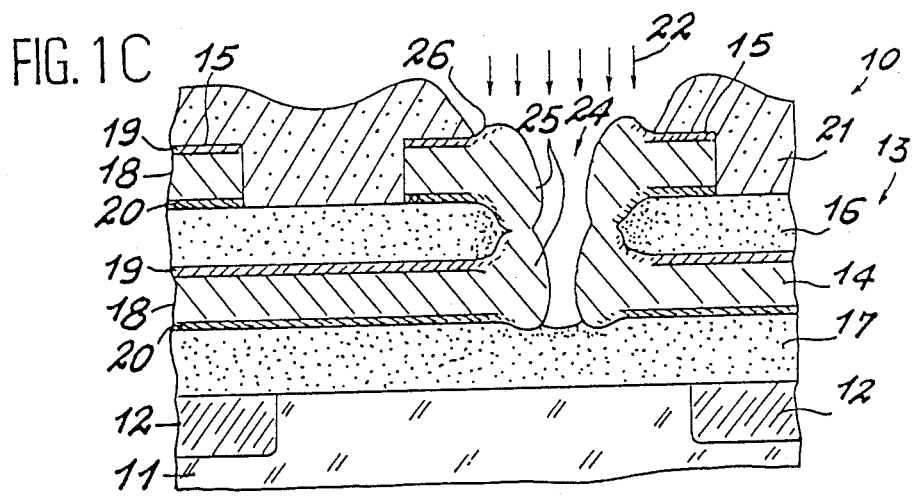

FIGS. 1B and 1C show an example of how the method according to the invention is performed. In FIG. 1B, a laser beam 22 is applied, its power and diameter and the duration of its action being determined such as to make an opening 23 in the passivation layer 21 and in the upper conductor 15. Generally, it suffices to open the upper conductor 15 at least partly. In FIG. 1C, a second pulse of the laser beam 22 is being applied, its power and diameter and the duration of its action being regulating in such a manner as to make an opening 24 through the dielectric layer 16 and the lower conductor 14, and to form in the opening 24, beginning at the two conductors 14, 15, two respective beads 25, which unite to form the desired connection or link 26. This connection or link 26 forms a substantially continuous ring in the opening extending from and between the first and second conductors 14, 15, as is apparent when considering the three-dimensional structure depicted in cross-section in FIG. 1C. Generally, it again suffices to open the lower conductor 14 at least partly.

With an integrated circuit 10 the characteristics of which are described above and with a laser beam 22 which is 5 $\mu m$ in diameter, experience has shown that the power and duration to be assigned to each of these two pulses are as indicated in the diagram of FIG. 2. In this diagram, the time t, measured in seconds, is plotted on the abscissa along a logarithmic scale, representative of the duration of a pulse, and the power P in watts of the beam, measured to the top of the passivation layer 21 is plotted on the ordinate in a linear scale. The advantageous range 27 for performing the method is indicated by shading in the drawing. It is apparent that each of the two pulses must have an approximate minimal duration t1 of 50 microseconds and a maximal duration t2 of 0.2 milliseconds, a minimal power P1 of 1 watt and a maximal power P2 of 2.5 watts.

These values were determined as follows. The minimal power P1 is imposed in order to enable the necessary chemical reactions for obtaining the connection 26. The minimal duration t1 is the time necessary for producing these reactions. Beyond the duration t2, undesirable reactions, in terms of obtaining a connection of good quality, are observed. Beyond the power P2, it is found that the electrical insulation obtained by the layer 17 is altered underneath the connection 26.

Although this example uses two pulses, it has been found that a different number can also offer an effective and reliable connection 26 according to the invention. Experience has shown that one pulse can suffice, although the power/duration range for the application of the pulse proves to be smaller than the range 27 shown in FIG. 2. It will be understood that this pulse must meet all the conditions required for forming the connection 26, while in the above-described example each of the two pulses had to meet only some of these conditions. The use of two pulses accordingly has the advantage of assuring an effective connection, because a larger application range 27 has been used. With more than three pulses, an alteration in the insulating layer 17 is found, which is due to the accumulation of energy of the laser beam pulses. The example selected is accordingly the preferred embodiment for performing the method according to the invention.

Generally, tests performed thus far have shown that the method according to the invention is obtained satisfactorily by determining the minimal power P1 of one pulse of the beam 22 so as to produce the desired chemical reactions with a view to obtaining the connection 26, the minimal duration t1 causing these reactions to appear, and the maximal duration t2 preventing undesirable chemical reactions, and by determining the number of pulses and the maximal power of each pulse in such a manner as not to alter the insulating layer 17 under the connection 26.

In summary, the invention offers the advantage of using a laser of low power and of obtaining a reliable connection of good quality in a simple manner. Another advantage is to do so in the presence of the passivation layer 21. It has also been found that this layer plays a very important role in forming the connection. It is thought that this role consists in the reinforcement of the surface tension of the upper conductors 15 and thus contributes to the formation of the beads 25.

What is claimed is:

1. A method for creating a programmable connection of an upper and lower superimposed conductor of an interconnect system of an integrated circuit, each of said conductors being formed of a metal strip provided with an upper and a lower film of a material having a melting point substantially higher than a melting point of said metal strip, said conductors being separated by a dielectric layer and said upper conductor being covered by an insulating passivation layer, said connection being effected through an opening in said insulating layer, said upper conductor, said dielectric layer, and at least a portion of said lower conductor, comprising the steps of:
   (a) applying at least a first laser beam pulse to make an initial opening in at least said insulating layer; and
   (b) selectively controlling one or more of a power, a diameter, a number of pulses and a duration of pulses of said laser beam; whereby said application of at least said first laser beam pulse, and said control of said power, diameter and duration of said pulse, and said number of pulses of said laser beam create said opening through said insulating layer, through said upper conductor, through said dielectric layer, and through at least said portion of said lower conductor and further form a substantially continuous ring by controlled melting, beginning respectively at said upper and lower conductors, and wherein said ring extends between said conductors in forming said connection.

2. A method as defined by claim 1 further comprising applying a first laser beam pulse to make an opening (23) in the insulating layer (21) and at least partly in the upper conductor (15), and then applying a second pulse to form the opening (24) and the connection (26).

3. A method as defined by claim 1, wherein a minimal power P1 of a laser beam pulse is determined in such a manner as to produce desired chemical reactions with a view to obtaining the connection (26), selecting a minimal duration (t1) of the pulse being that required for said reactions to appear and a maximal duration (t2) selected to prevent undesirable chemical reactions, and wherein said number of pulses and a maximal power of each pulse are determined in such a manner as not to substantially alter an insulating layer (17) under the connection (26).

4. A method as defined by claim 2, wherein a minimal power P1 of a laser beam pulse is determined in such a manner as to produce desired chemical reactions with a view to obtaining the connection (26), selecting a minimal duration (t1) of the pulse being that required for said reactions to appear and a maximal duration (t2) selected to prevent undesirable chemical reactions, and wherein said number of pulses and a maximal power of each pulse are determined in such a manner as not to substantially alter an insulating layer (17) under the connection (26).

5. A method as defined by claim 1, wherein the metal comprising the strip (18) of the conductors (14, 15) is substantially of aluminum.

6. A method as defined by claim 2, wherein the metal comprising the strip (18) of the conductors (14, 15) is substantially of aluminum.

7. A method as defined by claim 3, wherein the metal comprising the strip (18) of the conductors (14, 15) is substantially of aluminum.

8. A method as defined by claim 4, wherein the metal comprising the strip (18) of the conductors (14, 15) is substantially of aluminum.

9. A method as defined by claim 1, wherein said films are of an alloy of titanium and tungsten.

10. A method as defined by claim 2, wherein said films are of an alloy of titanium and tungsten.

11. A method as defined by claim 3, wherein said films are of an alloy of titanium and tungsten.

12. A method as defined by claim 4, wherein said films are of an alloy of titanium and tungsten.

13. A method as defined by claim 5, wherein said films are of an alloy of titanium and tungsten.

14. A method as defined by claim 6, wherein said films are of an alloy of titanium and tungsten.

15. A method as defined by claim 7, wherein said films are of an alloy of titanium and tungsten.

16. A method as defined by claim 8, wherein said films are of an alloy of titanium and tungsten.

17. A method as defined by claim 1, wherein said passivation layer includes silicon nitride ($Si_3N_4$).

18. A method as defined by claim 2, wherein said passivation layer includes silicon nitride ($Si_3N_4$).

19. A method as defined by claim 3, wherein said passivation layer includes silicon nitride ($Si_3N_4$).

20. A method as defined by claim 4, wherein said passivation layer includes silicon nitride ($Si_3N_4$).

21. A method as defined by claim 5, wherein said passivation layer includes silicon nitride ($Si_3N_4$).

22. A method as defined by claim 6, wherein said passivation layer includes silicon nitride ($Si_3N_4$).

23. A method as defined by claim 7, wherein said passivation layer includes silicon nitride ($Si_3N_4$).

24. A method as defined by claim 8, wherein said passivation layer includes silicon nitride ($Si_3N_4$).

25. A method as defined by claim 9, wherein said passivation layer includes silicon nitride ($Si_3N_4$).

26. A method as defined by claim 10, wherein said passivation layer includes silicon nitride ($Si_3N_4$).

27. A method as defined by claim 11, wherein said passivation layer includes silicon nitride ($Si_3N_4$).

28. A method as defined by claim 12, wherein said passivation layer includes silicon nitride ($Si_3N_4$).

29. A method for creating a programmable connection of an upper and a lower superimposed conductor of an interconnect system of an integrated circuit, each of said conductors being formed of a metal strip provided with an upper and a lower film of a material having a melting point substantially higher than a melting point of said metal strip, said conductors being separated by a dielectric layer and said upper conductor being covered by an insulative passivation layer, said connection being effected through an opening through said insulating layer, through said upper conductor, through said dielectric layer, and through at least a portion of said lower conductor, comprising the steps of:
   (a) applying at least a first laser beam pulse to make an initial opening in at least said insulating layer; and
   (b) selectively controlling one or more of a power, a diameter, a number of pulses and a duration of pulses of said laser beam whereby said application of at least said first laser beam pulse, said control of said power, diameter, duration of pulse, and number of pulses create said opening through said insulating layer, said upper conductor, said dielectric layer, and at least said portion of said lower conductor, without substantial splashing of metal from said conductors, and further form an upper and a lower bead beginning respectively at said upper and lower conductors, said beads being united with one another in forming said connection.

30. A method for creating a programmable connection of an upper and a lower superimposed conductor of an interconnect system of an integrated circuit, each of said conductors being formed of a metal strip provided with an upper and a lower film of a material having a melting point substantially higher than a melting point of said metal strip, said conductors being separated by a dielectric layer and said upper conductor being covered by an insulating passivation layer, said connection being effected through an opening in said insulating layer, said upper conductor, said dielectric layer, and at least a portion of said lower conductor, comprising the steps of:

(a) applying a first laser beam pulse for a duration in the range of about 50 microseconds to about 0.2 milliseconds, a power of said laser beam pulse being in the range of about one to 2.5 watts; a diameter of said laser beam pulse being on the order of about 5 microns, to create an opening through said passivation layer and at least a portion of said upper conductor;

(b) applying a second laser beam pulse through said opening for a duration in the range of about 50 microseconds to about 0.2 milliseconds, a power of said laser beam pulse being in the range of about one to 2.5 watts, a diameter of said laser beam pulse being on the order of about 5 microns, to further extend said opening through said passivation layer, said upper conductor, said dielectric layer and at least a portion of said lower conductor, and to form by a controlled melting an upper bead and a lower bead extending respectively from said upper conductor and said lower conductor between said conductors and joined to form said connection.

* * * * *